United States Patent [19]

Kaufman

[11] Patent Number: 4,554,613
[45] Date of Patent: Nov. 19, 1985

[54] MULTIPLE SUBSTRATE CIRCUIT PACKAGE

[76] Inventor: Lance R. Kaufman, 131 N. White Oak Way, Mequon, Wis. 53092

[21] Appl. No.: 546,997

[22] Filed: Oct. 31, 1983

[51] Int. Cl.$^4$ .............................................. H05K 1/18
[52] U.S. Cl. ............................... 361/386; 174/52 FP; 174/52 PE; 361/388; 361/412; 361/421; 339/17 M; 339/17 LM
[58] Field of Search ...................... 339/17 LM, 17 M; 174/52 FP; 361/386, 388, 412, 413, 421

[56] References Cited

U.S. PATENT DOCUMENTS

| | | | |
|---|---|---|---|
| 3,390,308 | 6/1968 | Marley | 174/52 FP |
| 3,689,683 | 9/1972 | Paletto et al. | 174/52 FP X |
| 3,739,232 | 6/1973 | Grossman et al. | 361/414 X |
| 3,838,984 | 10/1974 | Crane et al. | 174/52 FP X |
| 3,958,075 | 5/1976 | Kaufman | 174/16 HS |
| 4,054,238 | 10/1977 | Lloyd et al. | 174/52 FP X |
| 4,156,148 | 5/1979 | Kaufman | 357/19 X |
| 4,196,411 | 4/1980 | Kaufman | 338/314 |
| 4,215,235 | 7/1980 | Kaufman | 174/52 PE |
| 4,218,724 | 8/1980 | Kaufman | 361/395 |
| 4,250,481 | 2/1981 | Kaufman | 338/163 |
| 4,257,091 | 3/1981 | Kaufman | 363/85 |
| 4,266,140 | 5/1981 | Kaufman | 357/19 X |
| 4,358,173 | 11/1982 | Conrad | 339/17 LM X |
| 4,394,530 | 7/1983 | Kaufman | 174/16 HS |

Primary Examiner—R. R. Kucia
Attorney, Agent, or Firm—Andrus, Sceales, Starke & Sawall

[57] ABSTRACT

A high power circuit package 2 is disclosed for power conditioning electronic circuits. In one embodiment, a plurality of separate ceramic substrates 3-8 are provided, with a common lead frame stamping 12 bonded to all of the substrates. Means are disclosed for aligning the lead frame, preventing the substrates from sliding together during bonding, and for enabling epoxy encapsulation after bonding. In other embodiments, lead frame structure and jumper posts 65-68 and buses 70, 72 are disclosed for selective interconnection of designated circuit sections. In other embodiments, power terminal extension structure 44 is disclosed.

17 Claims, 2 Drawing Figures

MULTIPLE SUBSTRATE CIRCUIT PACKAGE

BACKGROUND AND SUMMARY

The invention relates to compact circuit packages for electronic circuits including high power applications.

A circuit package typically includes a base plate having an electrically insulative thermally conductive substrate, such as ceramic, bonded thereto. Circuit means, including lead frames and circuit components, are bonded to the substrate. A housing covers the base plate, substrate and circuit means. The other side of the base plate is typically mounted against a heat sink.

Though not limited thereto, the invention particularly arose from efforts to design a circuit package for high power applications where the base plate is too large for an optimally effective single substrate. In this aspect of the invention, a plurality of electrically insulative thermally conductive separate substrates are bonded on the base plate. The lead frame means is formed from a single unitary integral member which is bonded to the substrates in a single simple operation, such as solder reflow, which also bonds the substrates to the base plate. Portions of the lead frame are bent upwardly and extend outside of the housing for external circuit connection.

Alignment means is provided, including a hole in the lead frame aligned with a hole in the base plate through a gap between the substrates. In one form, pre-bonding alignment is effected by rotating the lead frame about a pin through the alignment holes and the gap between the substrates until the lead frame reaches a designated stop.

The circuit means and the substrates are encapsulated with epoxy or the like. The lead frame has a set of holes aligned with gaps between the substrates therebelow for enabling air bubbles to escape during epoxy encapsulation such that epoxy can flow under the lead frame and between the substrates. The holes also reduce surface tension of the solder or other bonding material, so as to prevent the substrates from sliding together.

In another aspect of the invention, improved design flexibility for high power applications is provided by a plurality of electrically conductive shouldered jumper posts received in respective holes of the lead frames. Jumper bus means are received on the jumper posts for selectively interconnecting designated sections of the circuit means. The jumper bus is spaced above other sections of the circuit means.

In another aspect of the invention, a circuit package is provided with power terminal extensions having an outer end adapted for external circuit connection and having an inner bifurcated end mounted to and receiving a respective terminal portion of the lead frame between the bifurcations. Notches are provided in the lead frame terminal portion edges for locating and aligning respective power terminal extensions. The power terminal extensions have notches at their edges for locking the extensions in the housing and providing additional support for the extensions. The extensions are bonded to the terminal portions of the lead frame by solder or the like. The bifurcations of the inner end of the terminal extensions have one or more holes therethrough for insuring the flow of solder or like bonding material in and around the interface joint of the terminal extensions and the terminal portions of the lead frame.

DETAILED DESCRIPTION

Figure 1:
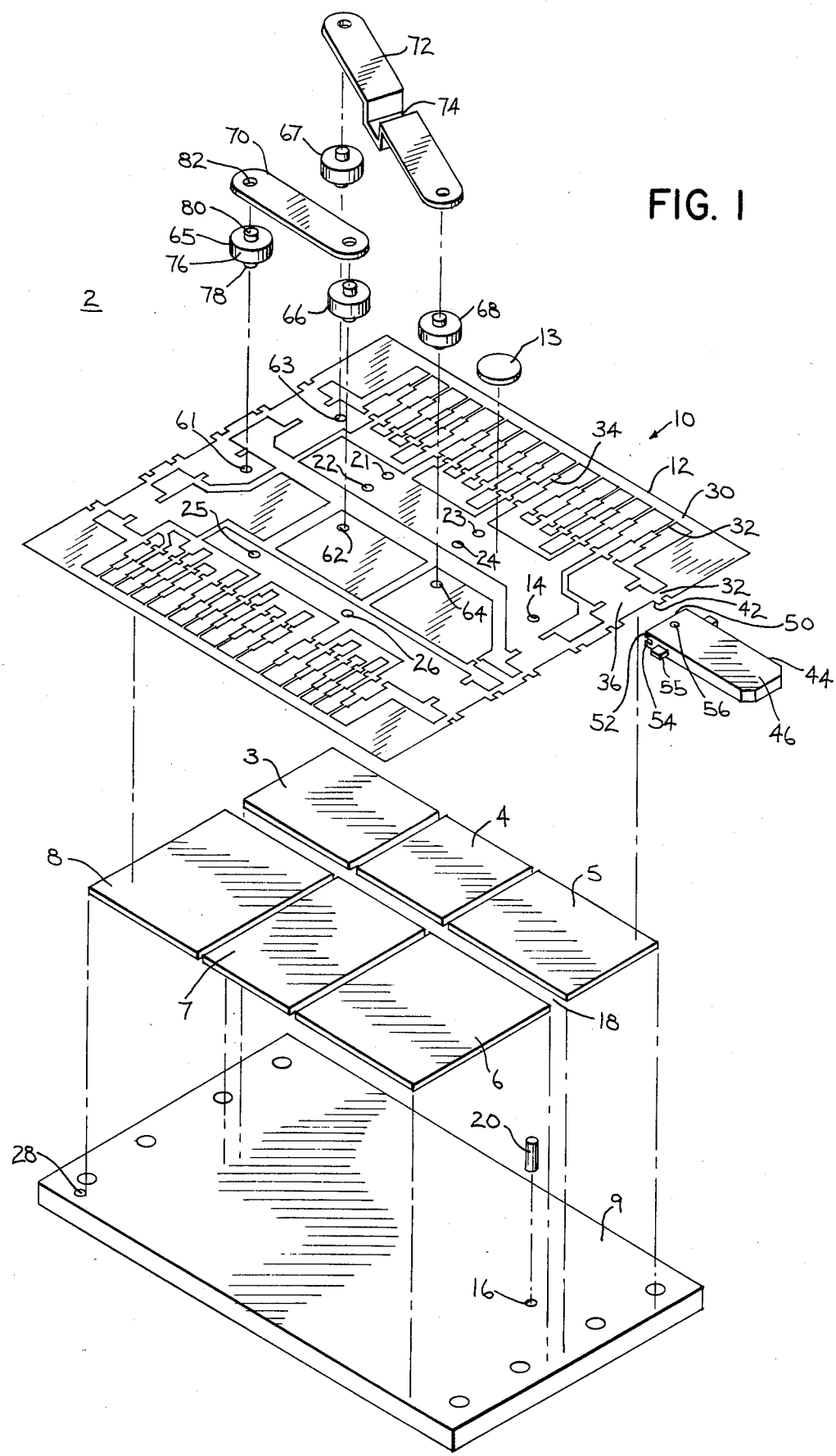
FIG. 1 is a pre-assembly exploded isometric view of a circuit package in accordance with the invention.
Figure 2:
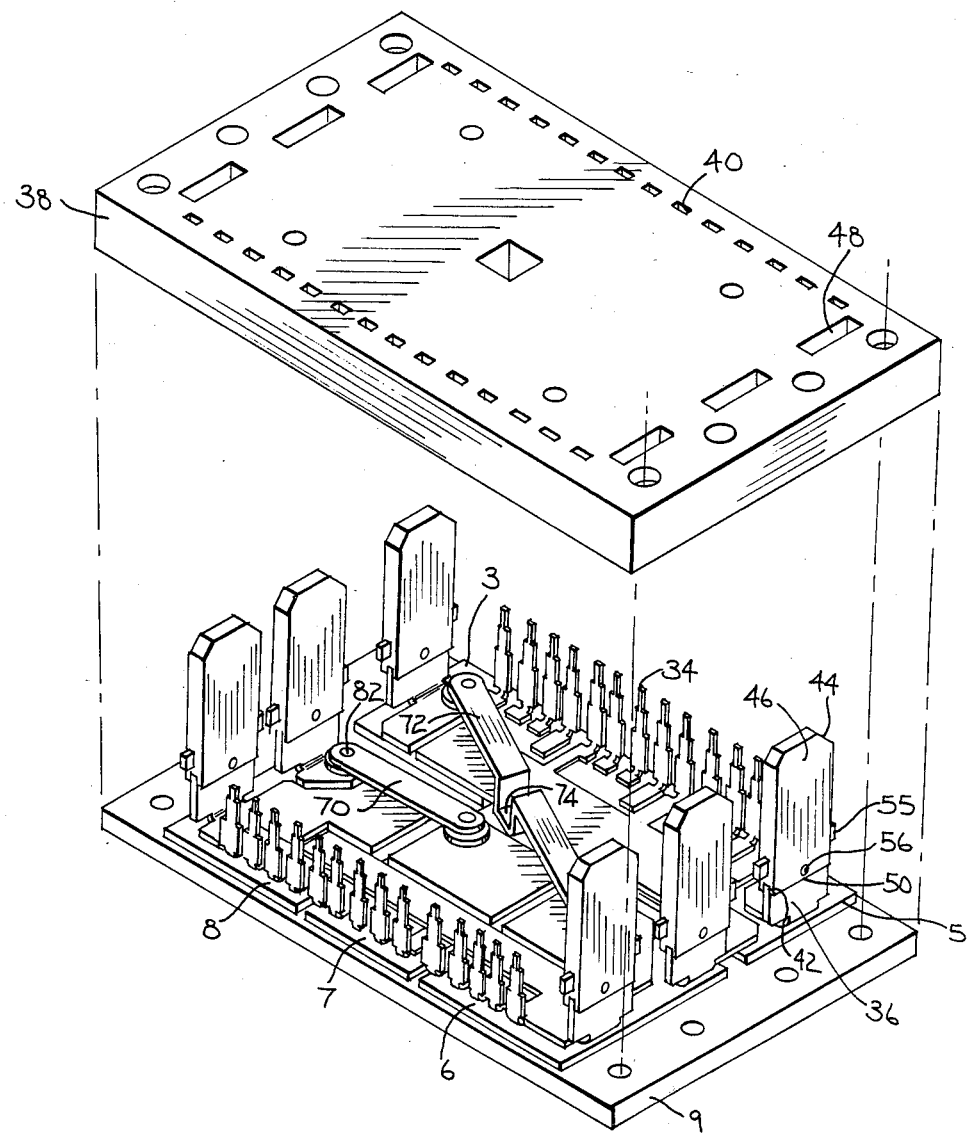
FIG. 2 is an isometric assembly view of a circuit package in accordance with the invention, with the cover removed.

There is shown in FIGS. 1 and 2 a circuit package 2 for high power applications. A plurality of electrically insulative thermally conductive separate substrates 3 through 8, such as ceramic or the like, are bonded on a base plate 9, such as copper or the like. Circuit means 10, including lead frame means 12 and circuit components one of which is shown by way of example at 13, are bonded on the plurality of substrates. Lead frame 12 is formed from a single unitary integral member such as by stamping or etching. Stamping 12 lays flat across substrates 3 through 8 and is substantially coplanar therewith. Substrates 3 through 8 are applied with bonding material such as solder or the like on both sides. In a single operation, such as solder reflow, substrates 3 through 8 are bonded to base plate 9 and lead frame 12 is bonded to substrates 3 through 8.

Pre-bonding alignment of lead frame 12 is provided by alignment means including a hole 14 in lead frame 12 aligned with a hole 16 in base plate 9 through a gap 18 between the substrates such as 5 and 6. In one form, alignment is effected by rotating lead frame 12 about a pin such as 20 through alignment holes 14 and 16 and gap 18 until lead frame 12 reaches a designated stop.

After the bonding operation, circuit means 10 and substrates 3 through 8 are encapsulated with epoxy or the like. Lead frame 12 has a set of holes 21 through 26, and 14, aligned with gaps between the substrates therebelow for enabling air bubbles to escape during epoxy encapsulation such that epoxy can flow under lead frame 12 and between the substrates. Holes 21 through 26, and 14, also reduce surface tension of the solder during the bonding operation, so as to prevent substrates 3 through 8 from sliding together. In another form of pre-bonding alignment, base plate 9 has an offset alignment hole 28 which together with one of the lead frame holes in the set 14 and 21 through 26 provides a two-dimensional plane of reference for locating the plurality of substrates 3 through 8 and circuit means 10.

After the bonding operation, the outer periphery 30 of lead frame 12 is cut away as at 32. The control terminal portions 34 and the power terminal portions 36 of the lead frame are bent upwardly, FIG. 2. A housing 38 covers the base plate, substrates and circuit means from above. The bottom of base plate 9 is mounted against a heat sink or the like (not shown). Lead frame control terminal portions such as 34 extend outside of housing 38 through apertures such as 40, for external circuit connection.

Lead frame power terminal portions such as 36 have notches such as 42 at their edges for locating and aligning a respective power terminal extension such as 44. Power terminal extension 44 has an outer end 46 which in assembled condition extends upwardly through an aperture such as 48 in housing 38 for external circuit connection. Power terminal extension 44 has an inner bifurcated end 50 mounted to and receiving lead frame terminal portion 36 between the bifurcations 52 and 54. Power terminal extension 44 has notches such as 55 at its edges for locking terminal extension 44 in housing 38 and providing additional support for the terminal extension. Terminal extension 44 is bonded to lead frame terminal portion 36 by solder or like bonding material. Bifurcations 52 and 54 or the inner end 50 of terminal extension 44 have one or more holes such as shown at 56 for insuring the flow of bonding material in and around the interface joint of terminal extension 44 and lead frame terminal portion 36.

Lead frame 12 has another set of holes such as shown at 61 through 64. A plurality of electrically conductive shouldered jumper posts such as 65 through 68 are received in respective lead frame holes 61 through 64. Jumper buses such as 70 and 72 are received on the jumper posts for selectively interconnecting designated sections of circuit means 10. The jumper buses are spaced above other sections of the circuit means. The jumper buses may have various configurations, and may include central sections such as 74 which extend downwardly to contact and/or support intermediate circuit portions. Each jumper post such as 65 has a central shouldered ledge portion 76 and oppositely extending reduced diameter trunions 78 and 80 extending into mating holes such as 61 and 82 respectively in lead frame 12 and the jumper bus such as 70. The jumper bus is spaced above the substrate portion of lead frame 12 by the height of the central shouldered ledge portion 76 of the jumper post.

It is recognized that various modifications are possible within the scope of the appended claims.

I claim:

1. A circuit package for high power application comprising:
    a base plate;
    a plurality of electrically insulative thermally conductive separate substrates bonded on said base plate;
    circuit means, including lead frame means, bonded on said plurality of substrates; and
    alignment means including a hole in said lead frame means aligned with a hole in said base plate through a gap between said substrates.

2. The invention according to claim 1 wherein alignment is effected by rotating said lead frame means about a pin through said alignment holes and said gap between said substrates until said lead frame means reaches a designated stop.

3. A circuit package for high power applications comprising:
    a base plate;
    a plurality of electrically insulative thermally conductive separate substrates bonded on said base plate; and
    circuit means, including lead frame means, bonded on said plurality of substrates,
    wherein:
    said circuit means and said substrate are encapsulated with flowable material; and
    said lead frame means has a set of holes aligned with gaps between said substrates therebelow for enabling air bubbles to escape during encapsulation such that said flowable material can flow under said lead frame means and between said substrates.

4. The invention according to claim 3 wherein said substrates are applied with bonding material on both sides, said holes reducing surface tension of said bonding material so as to prevent said substrates from sliding together.

5. A circuit package for high power applications comprising:
    a base plate;
    a plurality of electrically insulative thermally conductive separate substrates bonded on said base plate; and
    circuit means, including lead frame means, bonded on said plurality of substrates,
    wherein:
    said lead frame means has a set of holes aligned with gaps between said substrates therebelow; and
    said base plate has an alignment hole therein which together with one of said holes in said lead frame means provides a two-dimensional plane of reference for locating said plurality of substrates and said circuit means.

6. A circuit package for high power applications comprising:
    a base plate;
    electrically insulative thermally conductive substrate means bonded on said base plate;
    circuit means, including lead frame means, bonded on said substrate means, said lead frame means having a set of holes;
    a plurality of electrically conductive shouldered jumper posts received in respective said holes of said lead frame means; and
    jumper bus means received on said jumper posts for selectively interconnecting designated sections of said circuit means, said jumper bus means being spaced above other sections of said circuit means,
    wherein each said jumper post has a central shouldered ledge portion and oppositely extending reduced diameter trunions extending into mating holes in respective said lead frame means and said jumper bus means, said jumper bus means being spaced above said lead frame means by the height of said central shouldered ledge portion of said jumper post.

7. The invention according to claim 6 wherein said substrate means comprises a plurality of separate substrates, and further comprising another set of holes comprising alignment holes in said lead frame means and said base plate aligned through a gap between said plurality of substrates.

8. A circuit package comprising:
    a base plate;
    electrically insulative thermally conductive substrate means bonded on said base plate;
    circuit means, including lead frame means, bonded on said substrate means, said lead frame means including terminal portions; and
    terminal extensions each having an outer end adapted for external circuit connection and having an inner bifurcated end mounted to and receiving a respective said terminal portion of said lead frame means between the bifurcations.

9. The invention according to claim 8 wherein said terminal portions of said lead frame means have notches at their edges for locating and aligning respective said terminal extensions.

10. The invention according to claim 9 comprising a housing covering said base plate, said substrate means and said circuit means, and wherein said terminal extensions have notches at their edges for locking said terminal extensions in said housing and providing additional support for said terminal extensions.

11. The invention according to claim 8 wherein said terminal extensions are bonded to respective said terminal portions of said lead frame means, and wherein the bifurcations of the inner end of said terminal extensions have one or more holes therethrough for insuring the flow of bonding material in and around the interface joint of said terminal extensions and said terminal portions of said lead frame means.

12. A circuit package for high power applications comprising:
   a base plate;
   a plurality of electrically insulative thermally conductive separate substrates bonded on said base plate;
   circuit means, including lead frame means, bonded on said plurality of substrates;
   a first set of holes in said lead frame means aligned with gaps between said substrates;
   a second set of holes in said lead frame means;
   a plurality of electrically conductive shouldered jumper posts received in respective said holes of said second set; and
   jumper bus means received on respective said posts for selectively interconnecting designated sections of said circuit means, said jumper bus means being spaced above other sections of said circuit means.

13. The invention according to claim 12 wherein each said jumper post has a central shouldered ledge portion and oppositely extending reduced diameter trunions extending into mating holes in respective said lead frame means and said jumper bus means, said jumper bus means being spaced above said lead frame means by the height of said central shouldered ledge portion of said jumper post.

14. The invention according to claim 12 wherein said lead frame means includes power terminal portions, and further comprising separate power terminal extensions having an outer end adapted for external circuit connection and having an inner bifurcated end mounted to and receiving a respective said power terminal portion of said lead frame means between the bifurcations.

15. The invention according to claim 14 wherein said power terminal portions of said lead frame means have notches at their edges for locating and aligning respective said power terminal extensions.

16. The invention according to claim 15 comprising a housing covering said base plate, said substrates, said circuit means, said jumper posts and said jumper bus means, and wherein said power terminal extensions have notches at their edges for locking said power terminal extensions in said housing and providing additional support for said power terminal extensions.

17. The invention according to claim 14 wherein said power terminal extensions are bonded to respective said power terminal portions of said lead frame means, and wherein the bifurcations of the inner end of said power terminal extensions have one or more holes therethrough for insuring the flow of bonding material in and around the interface joint of said power terminal extension and said power terminal portion of said lead frame means.

* * * * *